(12) United States Patent
Maeda (10) Patent No.: US 10,276,095 B2
(45) Date of Patent: Apr. 30, 2019

(54) DISPLAY DEVICE AND METHOD OF DRIVING DISPLAY DEVICE

(71) Applicant: JOLED INC., Tokyo (JP)

(72) Inventor: Tomoyuki Maeda, Tokyo (JP)

(73) Assignee: JOLED INC., Tokyo (JP)

(*) Notice: Subject to any disclaimer, the term of this patent is extended or adjusted under 35 U.S.C. 154(b) by 158 days.

(21) Appl. No.: 15/504,848

(22) PCT Filed: Aug. 10, 2015

(86) PCT No.: PCT/JP2015/004017
§ 371 (c)(1),
(2) Date: Feb. 17, 2017

(87) PCT Pub. No.: WO2016/027435
PCT Pub. Date: Feb. 25, 2016

(65) Prior Publication Data
US 2017/0270855 A1  Sep. 21, 2017

(30) Foreign Application Priority Data
Aug. 21, 2014  (JP) .................. 2014-168792

(51) Int. Cl.
*H01L 51/00* (2006.01)
*G09G 3/3233* (2016.01)
(Continued)

(52) U.S. Cl.
CPC ......... *G09G 3/3233* (2013.01); *G09G 3/3266* (2013.01); *H01L 51/50* (2013.01);
(Continued)

(58) Field of Classification Search
None
See application file for complete search history.

(56) References Cited

U.S. PATENT DOCUMENTS 9,202,412 B2  12/2015  Odawara et al.
9,208,721 B2  12/2015  Odawara et al.
(Continued)

FOREIGN PATENT DOCUMENTS

JP  2007-286341  11/2007

OTHER PUBLICATIONS

U.S. Appl. No. 15/507,394 to Kazuki Sawa et al., filed Feb. 28, 2017.
(Continued)

*Primary Examiner* — Gustavo Polo
(74) *Attorney, Agent, or Firm* — Greenblum & Bernstein, P.L.C.

(57) ABSTRACT

A display device includes: a display unit including display pixels each of which includes: an organic EL element that emits light in response to a drive current; and a drive transistor that supplies a drive current corresponding to a magnitude of a luminance signal to the organic EL element; a measurement pixel located outside the display unit including: a measurement element composed of an organic EL element; and a measurement transistor that supplies a drive current to the measurement element; a current measurement unit that measures a current of the measurement pixel in a predetermined degradation state; a deviation calculation unit that calculates a deviation between a theoretical first correction amount of the luminance signal and a second correction amount of the luminance signal calculated from the measured current; and a luminance signal correction unit that corrects a theoretical third correction amount of the luminance signal of the display pixel.

7 Claims, 9 Drawing Sheets

(51) Int. Cl.
*H01L 51/50* (2006.01)
*G09G 3/3266* (2016.01)
(52) U.S. Cl.
CPC ........... *G09G 2300/0861* (2013.01); *G09G 2310/0251* (2013.01); *G09G 2310/0262* (2013.01); *G09G 2320/029* (2013.01); *G09G 2320/0233* (2013.01); *G09G 2320/043* (2013.01); *G09G 2320/045* (2013.01); *G09G 2320/0693* (2013.01); *G09G 2330/12* (2013.01); *G09G 2360/16* (2013.01); *H01L 51/0031* (2013.01)

(56) References Cited

U.S. PATENT DOCUMENTS

| | | |
|---|---|---|
| 2007/0242002 A1 | 10/2007 | Kawabe |
| 2014/0320042 A1 | 10/2014 | Yamamoto et al. |
| 2016/0232842 A1 | 8/2016 | Imai et al. |

OTHER PUBLICATIONS

International Search Report (ISR) from International Searching Authority (Japan Patent Office) in International Pat. Appl. No. PCT/JP2015/004017, dated Nov. 2, 2015.

DISPLAY DEVICE AND METHOD OF DRIVING DISPLAY DEVICE

TECHNICAL FIELD

The present disclosure relates to a display device using organic electroluminescent (EL) elements and a method of driving the display device.

BACKGROUND ART

As image display devices that use current-driven light emitting elements, organic EL displays using organic electroluminescent elements (hereafter referred to as "organic EL elements") are known. Organic EL displays have the advantages of favorable viewing angle characteristics and low power consumption.

An organic EL display includes a plurality of scan lines (a plurality of gate lines), a plurality of data lines (a plurality of source lines), a plurality of pixels, and drive circuits. Each of the plurality of pixels is located at the intersection of a scan line and a data line, and includes a switching element, a capacitance element, a drive transistor, and an organic EL element.

In the organic EL display, the voltage of the data line connected to the selected pixel is controlled to control the luminance of the selected pixel. Moreover, in the organic EL display, the voltage of the scan line connected to the selected pixel is controlled to control the light emission timing of the selected pixel (the timing of turning the drive transistor on is controlled).

CITATION LIST

Patent Literature

[PTL 1]
Japanese Unexamined Patent Application Publication No. 2007-286341

SUMMARY OF INVENTION

Technical Problem

However, there is a problem in that the drive transistor and the organic EL element gradually decrease in light emission amount (degrade with time) even when supplied with a luminance signal of the same voltage, due to current flowing during image display.

The present disclosure accordingly provides a display device that can prevent image quality degradation caused by the degradation of the organic EL element or drive transistor with a simpler device structure.

Solution to Problem

A display device according to one aspect of the present disclosure includes: a display unit including a plurality of display pixels each of which includes: an organic EL element that em light in response to a supplied current; and a drive transistor that supplies a drive current corresponding to a magnitude of a luminance signal to the organic EL element; a measurement pixel located outside the display unit and including: a measurement element composed of an organic EL element; and a measurement transistor that supplies a current corresponding to a magnitude of a measurement signal to the measurement element; a current measurement unit configured to measure a current flowing through the measurement pixel in a predetermined degradation state; a deviation calculation unit configured to calculate, for the measurement pixel in the degradation state, a deviation between a theoretically calculated first correction amount of the luminance signal and a second correction amount of the luminance signal calculated from the current measured by the current measurement unit; and a luminance signal correction unit configured to correct a theoretically calculated third correction amount of the luminance signal of the display pixel, using a result of calculating the deviation by the deviation calculation unit.

Advantageous Effects of Invention

The display device and the method of driving the display device according to the present disclosure can prevent image quality degradation caused by the degradation of the EL element with a simpler device structure.

DESCRIPTION OF EMBODIMENTS (Details of Problem)

The aforementioned problem, that is, the time degradation of the drive transistor and organic EL element, is described in more detail below with reference to FIGS. 1 to 4.

(Structure of Display Pixel)

Figure 1:
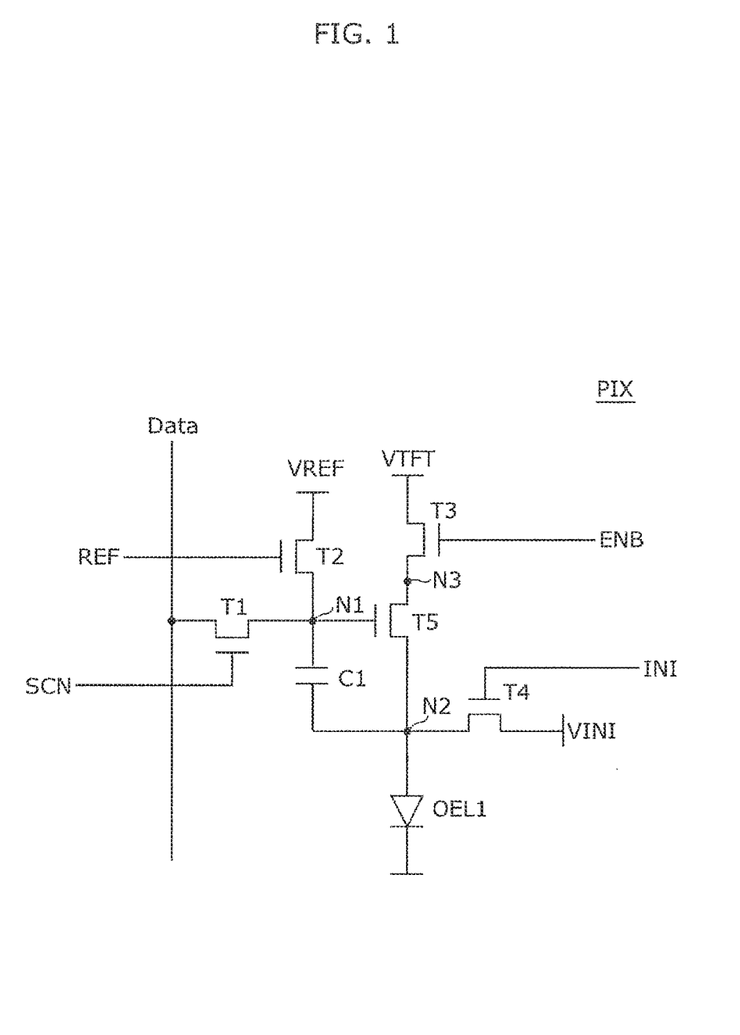
FIG. 1 is a circuit diagram illustrating the structure of a display pixel in an organic EL display.

FIG. 1 is a circuit diagram illustrating the structure of a display pixel in an organic EL display. A display pixel PIX corresponds to one of the three primary colors of R (red), G (green), and B (blue). A set of three display pixels PIX of RGB forms one pixel.

As illustrated in FIG. 1, the display pixel PIX includes switching elements T1 to T4, a capacitance element C1, a drive transistor T5, and an organic EL element (light emitting element) OEL1.

The switching element T1 is a thin film transistor (TFT), and switches the selection of the display pixel PIX. The switching element T1 has a gate terminal connected to a scan line SCN, a source terminal connected to a data line Data, and a drain terminal connected to a node N1.

The switching element T2 is a TFT, and switches the supply of a reference voltage VREF depending on the voltage of a control line REF. The switching element 72 has a gate terminal connected to the control line REF, one of a source terminal and drain terminal connected to the node N1, and the other one of the source terminal and drain terminal supplied with the reference voltage VREF.

The switching element T3 is a TFT, and switches the supply of a voltage VTFT depending on the voltage of a control line ENS, The switching element T3 has a gate terminal connected to the control line ENS, a source terminal connected to a node N3, and a drain terminal supplied with the voltage VTFT.

The switching element T4 is a TFT, and discharges the capacitance element C1 depending on the voltage of a control line INI. The switching element T4 has a gate terminal connected to the control line INI, one of a source terminal and drain terminal connected to a node N2, and the other one of the source terminal and drain terminal supplied with a voltage VINI.

The drive transistor T5 is a TFT, and supplies a drive current corresponding to the magnitude of a luminance signal to the organic EL element OEL1. The drive transistor T5 has a gate terminal connected to the node N1, a source terminal connected to the anode electrode of the organic EL element OEL1, and a drain terminal connected to the node N3.

The organic EL element is an element that emits light in response to the drive current supplied from the drive transistor T5. The organic EL element OEL1 has the anode electrode connected to the node N2.

The capacitance element C1 has one end connected to the node N1, and the other end connected to the node N2.

(Degradation of Drive Transistor T5)

The degradation of the drive transistor is described below, with reference to FIG. 2.

Figure 2:
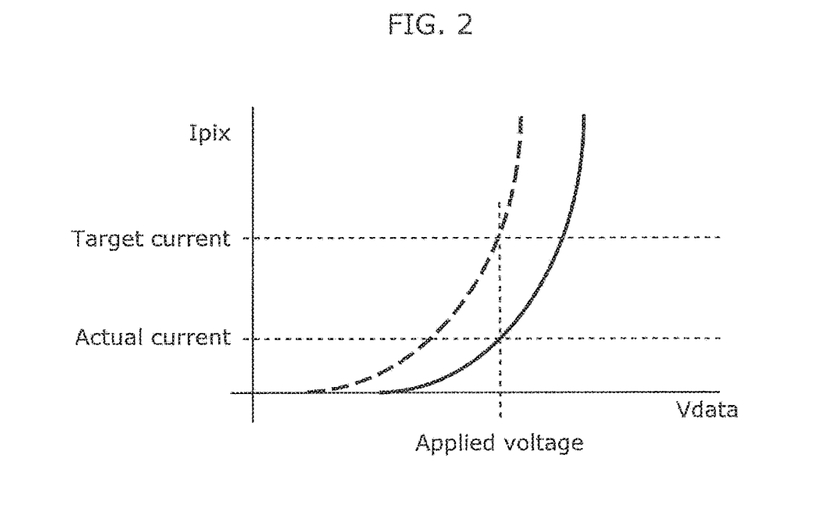
FIG. 2 is a graph illustrating the characteristics of a drive transistor before and after degradation.

FIG. 2 is a graph illustrating the characteristics of the drive transistor T5 before and after degradation. In FIG. 2, the dashed line indicates the IV characteristics of the drive transistor T5 before degradation, and the solid line indicates the IV characteristics of the drive transistor T5 after degradation.

As illustrated in FIG. 2, the drive transistor T5 gradually degrades due to the flow of current, and the amount of current that can flow between the source and drain terminals gradually decreases even in the case where the same voltage is applied to the gate terminal. In more detail, the current Ipix corresponding to the same voltage Vdata is smaller after the degradation of the drive transistor T5 than before the degradation of the drive transistor T5 ("initial curve" (dashed line) in the drawing).

(Degradation of Organic EL Element OEL1)

The degradation of the organic EL element is described below, with reference to FIG. 3.

Figure 3:
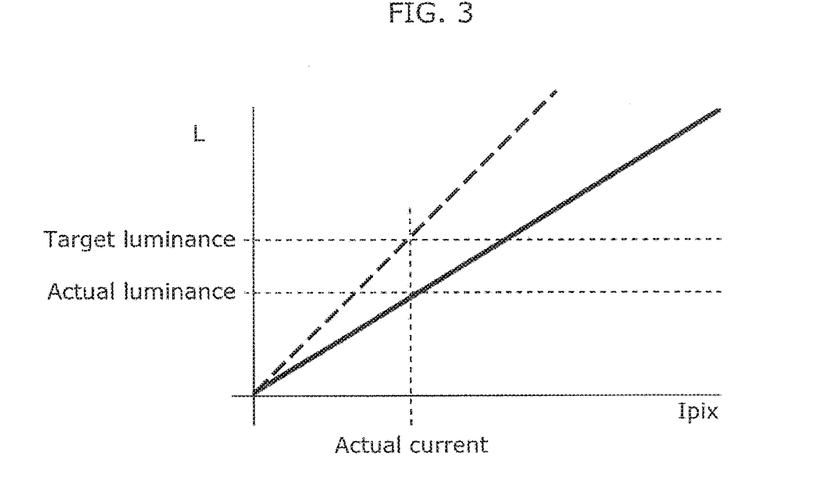
FIG. 3 is a graph illustrating the characteristics of an organic EL element before and after degradation.

FIG. 3 is a graph illustrating the characteristics of the organic EL element OEL1 before and after degradation. In FIG. 3, the dashed line indicates the characteristics of the organic EL element OEL1 before degradation, and the solid line indicates the characteristics of the organic EL element OEL1 after degradation.

As illustrated in FIG. 3, the organic EL element gradually degrades due to the flow of current, and the light emission amount gradually decreases even in the case where the same current is caused to flow. In more detail, the light emission amount L corresponding to the same drive current is smaller after the degradation of the organic EL element OEL1 than before the degradation of the organic EL element OEL1.

(Image Quality Degradation Due to Degradation of Drive Transistor T5 and Organic EL Element OEL1)

Image quality degradation due to the degradation of the drive transistor T5 and organic EL element OEL1 is described below, with reference to FIG. 4.

Figure 4:
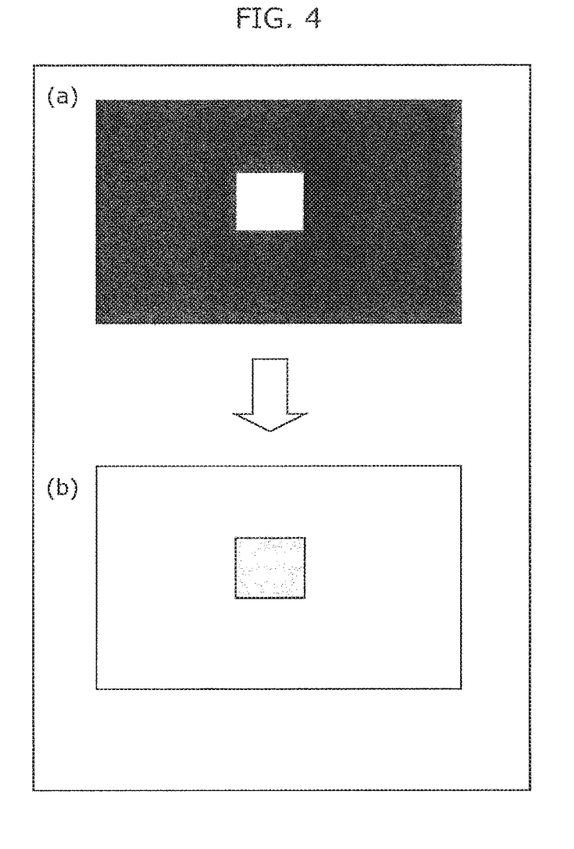
FIG. 4 is a diagram illustrating the state of the organic EL display in the case where part of the pixels has degraded.

FIG. 4 is a diagram illustrating the state of the organic EL display in the case where part of the pixels has degraded. For example in the case of continuously displaying an image using only part of the pixels (the white region in the drawing) as illustrated in (a) in FIG. 4 and then displaying white color in all pixels with the same data voltage as illustrated in (b) in FIG. 4, the apparent luminance (light emission amount) of the part of the pixels is lower than that of the other pixels.

An example of the method for addressing such degradation of the organic EL element is a method of calculating the correction amount of the current depending on the degradation state of the organic EL element and, depending on the degradation state of the drive transistor, theoretically calculating the correction amount of the gate voltage necessary to cause the corrected current to flow.

(Deviation Between Theoretical Value and Actual Degradation State)

However, there may be a deviation (difference) between a theoretically calculated light emission amount (hereafter referred to as "theoretical light emission amount" as appropriate) and an actual light emission amount (hereafter referred to as "measured light emission amount" as appropriate), in a display pixel in a predetermined degradation state. The deviation is caused by, for example, the recovery from the degradation at power off or the surrounding environment such as temperature or humidity.

Figure 5:
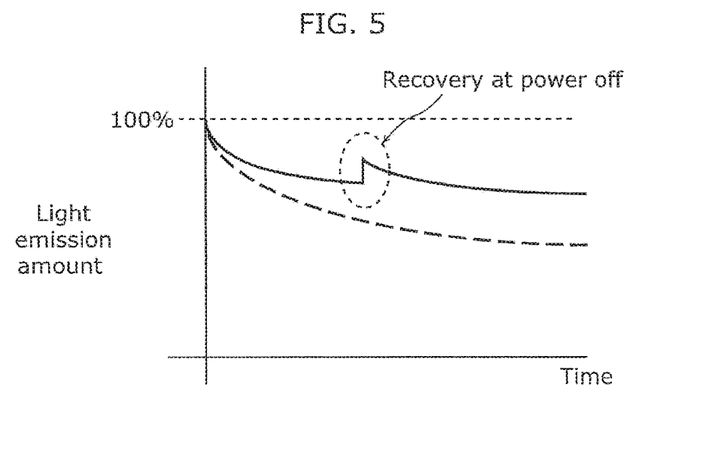
FIG. 5 is a diagram illustrating a deviation between a theoretical value and measured value of degradation.

FIG. 5 is a diagram illustrating the deviation between the theoretical light emission amount and the measured light emission amount. FIG. 5 illustrates the light emission amount in the case where the luminance signal of the same voltage is applied, with the pixel in its initial state being set to 100%. In FIG. 5, the dashed line indicates the theoretical light emission amount, and the solid line indicates the measured light emission amount. As illustrated in FIG. 5, there is the deviation between the theoretical light emission amount and the measured light emission amount due to, for example, the recovery from the degradation at power off.

Such a deviation between the theoretical light emission amount and the measured light emission amount causes a problem of insufficient accuracy in correcting the luminance signal based on the theoretical light emission amount.

Another example of the technique for addressing the degradation of the organic EL element is a method of providing a measurement pixel having the same structure as the display pixel PIX, measuring the current flowing through the organic EL element in the measurement pixel and the light emission amount of the organic EL element in the measurement pixel, and correcting the voltage and the like (for example, see Patent Literature (PTL) 1).

The method described in PTL 1 achieves more accurate correction as the correction is performed based on the measured current and the measured light emission amount.

However, the method described in PTL 1 is problematic in that both of the current and light emission amount of the organic EL element in the measurement pixel need to be measured.

To solve this problem, a display device according to one aspect of the present disclosure includes: a display unit including a plurality of display pixels each of which includes: an organic EL element that emits light in response to a supplied current; and a drive transistor that supplies a drive current corresponding to a magnitude of a luminance signal to the organic EL element; a measurement pixel located outside the display unit and including: a measurement element composed of an organic EL element; and a measurement transistor that supplies a current corresponding to a magnitude of a measurement signal to the measurement element; a current measurement unit configured to measure a current flowing through the measurement pixel in a predetermined degradation state; a deviation calculation unit configured to calculate, for the measurement pixel in the degradation state, a deviation between a theoretically calculated first correction amount of the luminance signal and a second correction amount of the luminance signal calculated from the current measured by the current measurement unit; and a luminance signal correction unit configured to correct a theoretically calculated third correction amount of the luminance signal of the display pixel, using a result of calculating the deviation by the deviation calculation unit.

The display device with the aforementioned structure calculates the deviation between the theoretical first correction amount of the luminance signal in the measurement pixel and the second correction amount of the luminance signal calculated from the measured current in the measurement pixel, and corrects the theoretical third correction amount of the luminance signal of the display pixel.

The display device with the aforementioned structure uses the measured current in the measurement element, and so achieves more accurate correction than in the conventional case where the luminance of the display pixel is corrected based only on the theoretical value. Moreover, while the display device described in PTL 1 needs to measure the current and light emission amount of the measurement element, the display device with the aforementioned structure can address the degradation of the drive transistor or organic EL element simply by measuring the current of the dummy pixel (measurement pixel). In other words, there is no need to measure the light emission amount in the measurement pixel.

Note that the correction amount may be the correction value, correction factor, or the like for the luminance signal, or the corrected luminance signal (corrected signal).

The current flowing through the measurement pixel specifically means the current flowing through the measurement element. Since the measurement transistor and the measurement element are connected in series, the current flowing between the source and drain of the measurement transistor is approximately the same as the current flowing through the measurement element.

For example, the deviation calculation unit may be configured to: perform a first deviation calculation process of calculating, for the measurement transistor in the degradation state, a first deviation between a first gate voltage calculated theoretically as a gate voltage necessary for obtaining a desired current and a second gate voltage calculated from the measured current as a gate voltage necessary for obtaining the desired current; perform a second deviation calculation process of calculating, for the measurement element in the degradation state, a second deviation between a first current calculated theoretically as a current necessary for obtaining a desired light emission amount and a second current calculated from the measured current as a current necessary for obtaining the desired light emission amount; and calculate the deviation by combining the first deviation and the second deviation.

The display device with the aforementioned structure can determine the degradation state more accurately for each of the drive transistor and organic EL element that differ in characteristics.

For example, the current measurement unit may be configured to adjust a source-drain voltage of the measurement transistor in the measurement pixel to cause the measurement transistor to operate in a saturated region, and measure the current flowing through the measurement pixel.

The display device with the aforementioned structure can determine the degradation state more accurately for the drive transistor which is the measurement transistor. The deviation of the correction amount of the drive transistor is calculated from the ratio between the theoretical gate voltage and the gate voltage calculated from the measured current. Hence, in the calculation of the correction amount of the luminance signal associated with the measurement transistor, the degradation state can be determined more accurately by causing the measurement transistor to operate in the saturated region.

For example, the current measurement unit may be configured to adjust a source-drain voltage of the measurement transistor in the measurement pixel to cause the measurement transistor to operate in a linear region, and measure the current flowing through the measurement pixel.

The display device with the aforementioned structure can determine the degradation state more accurately for the organic EL element. When the measurement transistor operates in the linear region, the change of the voltage of the organic EL element in the measurement pixel appears as the change of the current flowing through the measurement transistor. Accordingly, the change of the voltage of the organic EL element can be determined by causing the measurement transistor to operate in the linear region and measuring the current.

For example, the measurement pixel may be located between a scan line drive circuit that drives a scan line for supplying a drive signal to a gate terminal of the drive transistor in the display pixel and the display pixel.

The display device with the aforementioned structure has the measurement pixel located between the scan line drive circuit and the display unit, which makes it unnecessary to newly provide a scan line for the measurement element. In other words, the measurement element is located at such a position where the gate terminal of the measurement transistor can be connected to the scan line connected to the gate terminal of the drive transistor. In the display device with the aforementioned structure, the measurement pixel is located, for example, on the right and left of the display unit.

For example, the display unit may be made up of a plurality of blocks each of which includes a plurality of display pixels, the measurement pixel may be provided for each of the plurality of blocks, in proximity to the corresponding block, and the deviation calculation unit may be configured to calculate, for each of the plurality of blocks, the deviation using the current of the measurement pixel corresponding to the block.

The display device with the aforementioned structure calculates the deviation on a block basis, and so can address the degradation of the individual pixels more finely.

These general and specific aspects ray be implemented using a system, a method, an integrated circuit, a computer program, or a computer-readable recording medium such as CD-ROM, or any combination of systems, methods, integrated circuits, computer programs, or recording media.

The following describes an embodiment in detail with reference to drawings.

The embodiment described below shows a general or specific example. The numerical values, shapes, materials, structural elements, the arrangement and connection of the structural elements, steps, the processing order of the steps etc. shown in the following embodiment are mere examples, and do not limit the scope of the present disclosure. Of the structural elements in the embodiment described below, the structural elements not recited in any one of the independent claims representing the broadest concepts are described as optional structural elements.

[Embodiment]

A display device according to an embodiment is described below, with reference to FIGS. 6A to 10.

The display device in this embodiment calculates a deviation between a theoretically calculated first correction amount of a luminance signal and a second correction amount of the luminance signal calculated from a measured current, for a measurement pixel in a predetermined degradation state. The display device in this embodiment corrects a theoretically calculated third correction amount of a luminance signal of a display pixel, using the deviation. Thus, the display device in this embodiment can substantially obtain a fourth correction amount of the luminance signal of the display pixel calculated from the measured current. The display device in this embodiment is an organic EL display.

Although this embodiment describes an example where the correction amount is the corrected luminance signal (corrected signal), the correction amount may be the correction value (the difference from the luminance signal) or the correction factor for the luminance signal.

(1-1. Structure of Display Device)

Figure 6A:
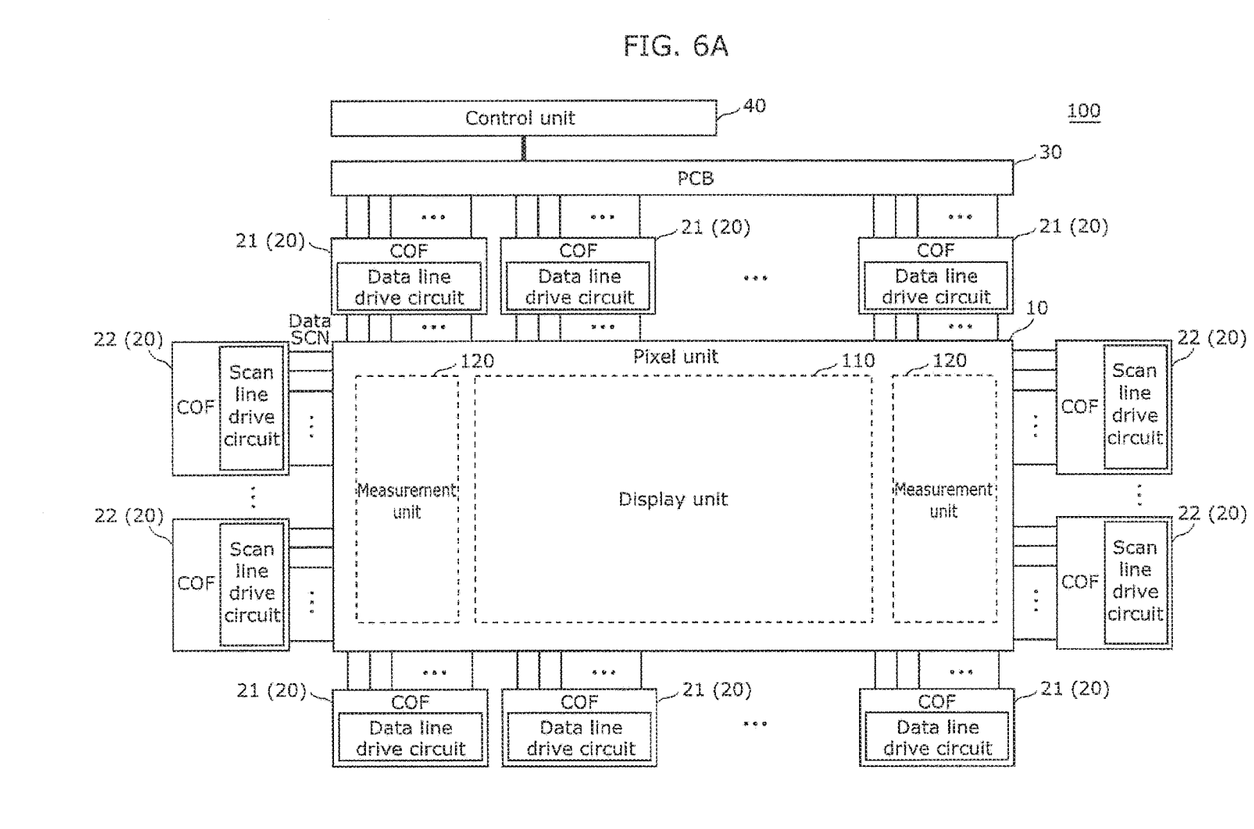
FIG. 6A is a block diagram illustrating an example of the structure of a display device (whole) in an embodiment.
Figure 6B:
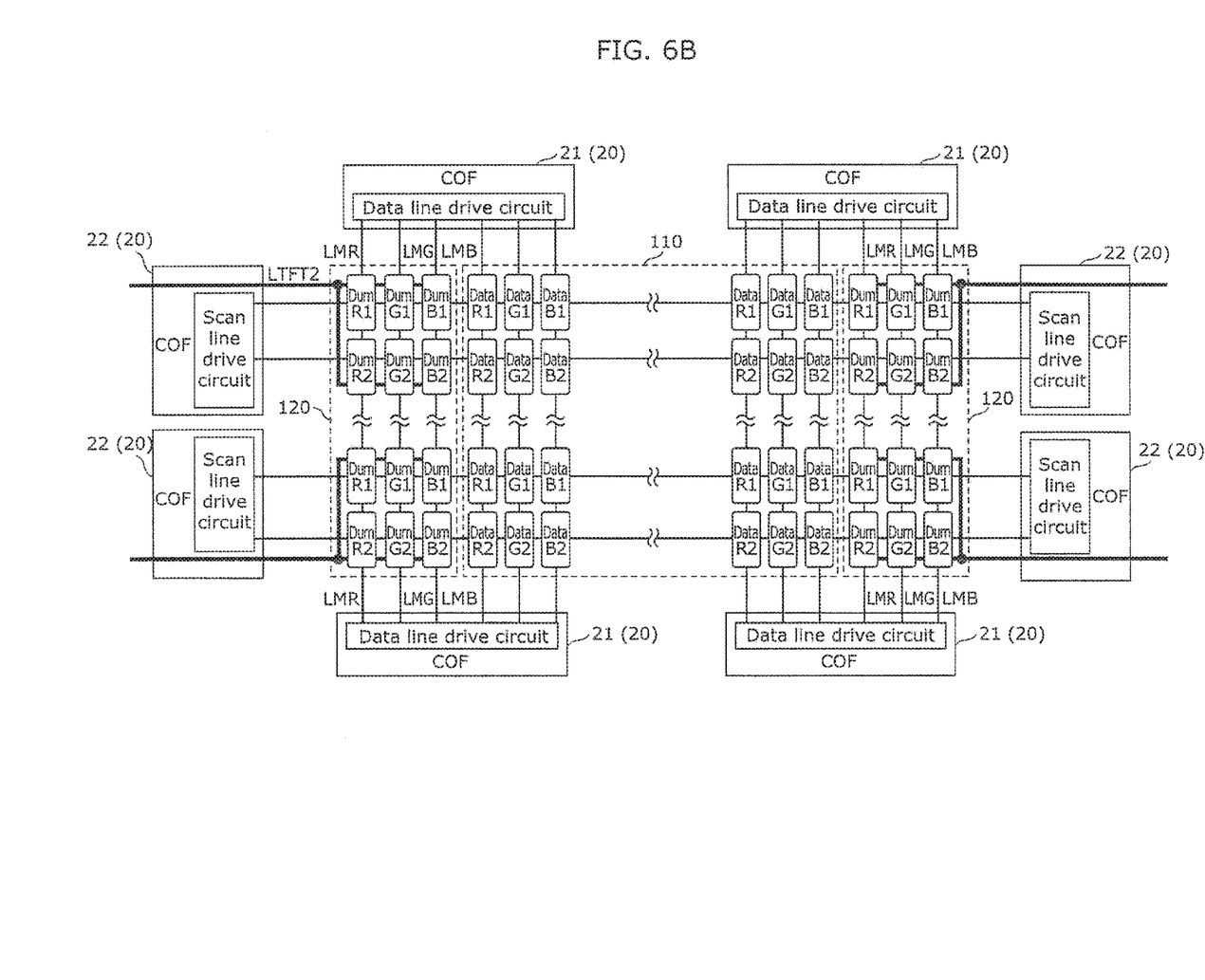
FIG. 6B is a block diagram illustrating an example of the structure of the display device (wiring of measurement pixels) in the embodiment.
Figure 6C:
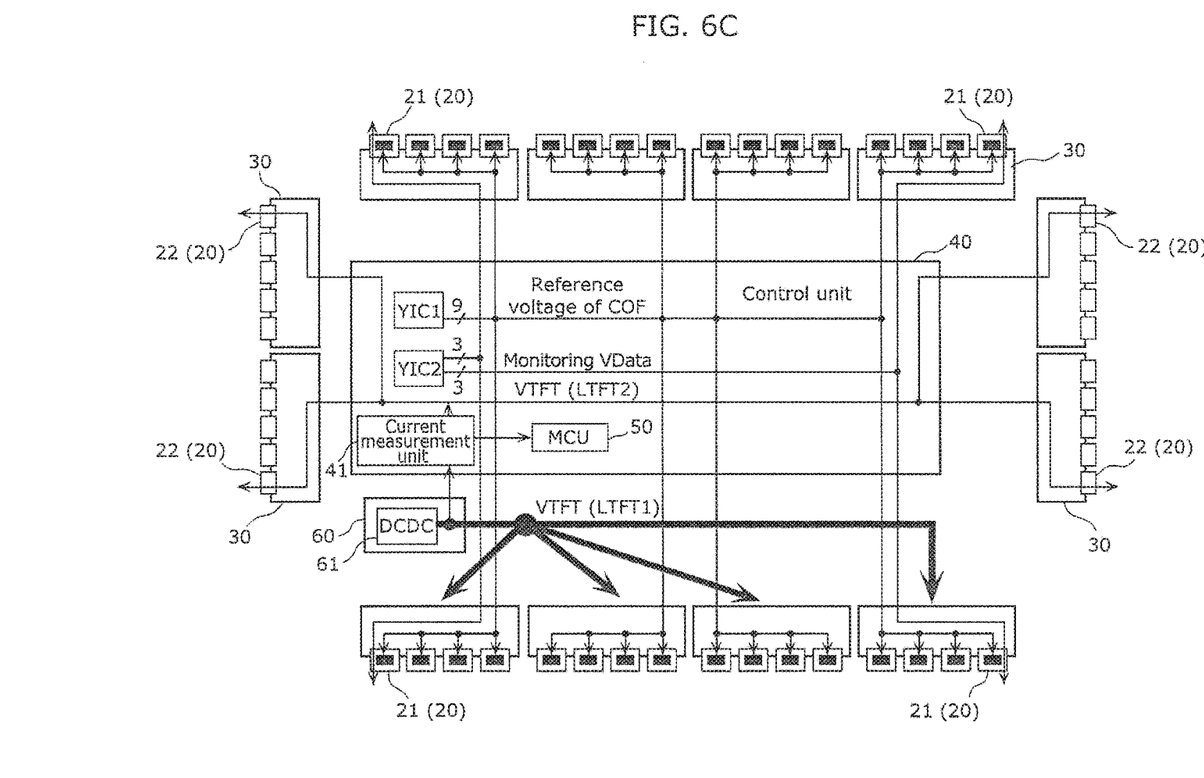
FIG. 6C is a block diagram illustrating an example of the structure of the display device (back side) in the embodiment.

The following describes an example of the structure of the organic EL display with reference to FIGS. 6A to 6C.

FIG. 6A is a block diagram illustrating an example of the structure of an organic EL display 100 in this embodiment. FIG. 6B is a diagram illustrating display pixels and measurement pixels included in the organic EL display 100 and the connection relationships of various lines. FIG. 6C is a diagram illustrating the structure of the organic EL display 100 as seen from the back side.

As illustrated in FIG. 6A, the organic EL display 100 includes a pixel unit 10, a plurality of lines, a plurality of COFs (chip on film or chip on flexible) 20, a printed circuit board (PCB) 30, and a control unit 40.

The pixel unit 10 includes a display unit 110 and a measurement unit 120.

The display unit 110 is a region for displaying images, and includes a plurality of display pixels located at a position visible to the user. The plurality of display pixels in the display unit 110 are arranged in a matrix. Each display pixel has the same structure as the display pixel PIX illustrated in FIG. 1, and includes the organic EL element OEL1 that emits light in response to a supplied current and the drive transistor T5 that supplies a drive current corresponding to the magnitude of a luminance signal (the voltage of the data line Data) to the organic EL element OEL1. Each display pixel PIX in this embodiment corresponds to one of the three primary colors. A set of three display pixels PIX of RGB forms one pixel. The plurality of display pixels PIX constituting one pixel are adjacent to each other.

The measurement unit 120 is a region for obtaining degradation measurement values, and includes a plurality of measurement pixels located at a position not visible to the user, for example, on the inside of the front cabinet. In more detail, the measurement pixels are located outside the display unit 110. Each measurement pixel has the same structure as the display pixel PIX. In the following description, the organic EL element (light emitting element) of the measurement pixel is referred to as "measurement element" and the drive transistor T5 of the measurement pixel as "measurement transistor" as appropriate. The characteristics of the measurement element and measurement transistor in the measurement pixel are substantially the same as the characteristics of the organic EL element OEL1 and drive transistor T5 in the display pixel PIX. Forming such measurement pixels enables more accurate correction.

In this embodiment, each measurement pixel is not a specially created pixel, but a redundant pixel formed around the display unit 110 in the manufacture of the organic EL display. These measurement pixels are not used for normal image display. The use of such pixels can prevent an increase in manufacturing cost as no special step for creasing measurement pixels is needed.

The measurement unit 120 in this embodiment is located between each COF 22 including the below-mentioned scan line drive circuit and the display unit 110. The measurement unit 120 located in this way can share scan lines SCN with the display unit 110.

The plurality of lines are lines for supplying power and various voltages to the pixel unit 10. As illustrated in FIGS. 6A to 6C, the plurality of lines include, for example, scan lines SCN, data lines Data, lines LTFT1, and monitoring lines LTFT2. The scan lines SCN are shared by the display unit 110 and the measurement unit 120, as mentioned above. The data lines Data are provided for the different colors (RGB), as illustrated in FIG. 6B.

Such wiring makes it possible to set the luminance signal (the signal of the Data line) of the measurement pixel independently of the display pixel. Meanwhile, the drive signal (the signal of the scan line SCN) of the measurement pixel is set to the same signal as the display pixel. A voltage VTFT (the voltage of the monitoring line LTFT2) supplied to the measurement pixel is the same voltage as the display pixel.

The line LTFT1 is a line for supplying the voltage VTFT to the display unit 110. The monitoring line LTFT2 is a line for supplying the voltage VTFT to the measurement unit 120. The line for supplying the voltage VTFT differs between the display unit 110 and the measurement unit 120, for the following reason. In this embodiment, it is difficult to directly measure the current of the display pixel PIX, and so the current of the measurement pixel is measured. The current flowing through the measurement pixel is measured by measuring the current flowing through the line for supplying the voltage VTFT. Hence, the dedicated monitoring line LTFT2 is provided for the measurement pixel.

The COFs 20 are formed by flexible cables including drive circuits for supplying various signals to the pixel unit 10, and are located around the pixel unit 10. The COFs 20 include COFs 21 connected to the data lines Data and COFs 22 connected to the scan lines SCN, as illustrated in FIG. 6A.

Each COF 21 (located above and below the pixel unit 10 in FIG. 6A) includes a data line drive circuit for supplying a voltage corresponding to a luminance signal to a data line Data. Although this embodiment describes the case where the COF 21 supplies a voltage corresponding to a luminance signal to the display unit 110 and the measurement unit 120 via the data line Data, this is not a limitation. A dedicated circuit may be provided to supply a voltage corresponding to a luminance signal to the measurement unit 120.

Each COF 22 (located right and left of the pixel unit 10 in FIG. 6A) includes a scan line drive circuit for supplying a drive signal to a scan line SCN connected to a selected display pixel.

The PCB 30 is a printed circuit board connecting the COFs 20 and the control unit 40. Although the PCB 30 is not connected to all COFs 20 in FIG. 6A due to space limitation, the PCB 30 actually connects all COFs 20 to the control unit 40.

The control unit 40 is a circuit that controls image display on the display unit 110, and uses a timing controller (TCOM). As illustrated in FIG. 6C, the control unit 40 includes a current measurement unit 41 and a micro control unit (MCU) 50. The MCU 50 functions as an image display circuit and a degradation addressing circuit.

The image display circuit is a circuit that causes the pixel unit 10 to display normal images. The image display circuit in the control unit 40 supplies a luminance signal, a drive signal, and the like to each COF 20 using power voltages supplied from a power circuit 60, to display a desired image on the display unit 110.

Figure 7:
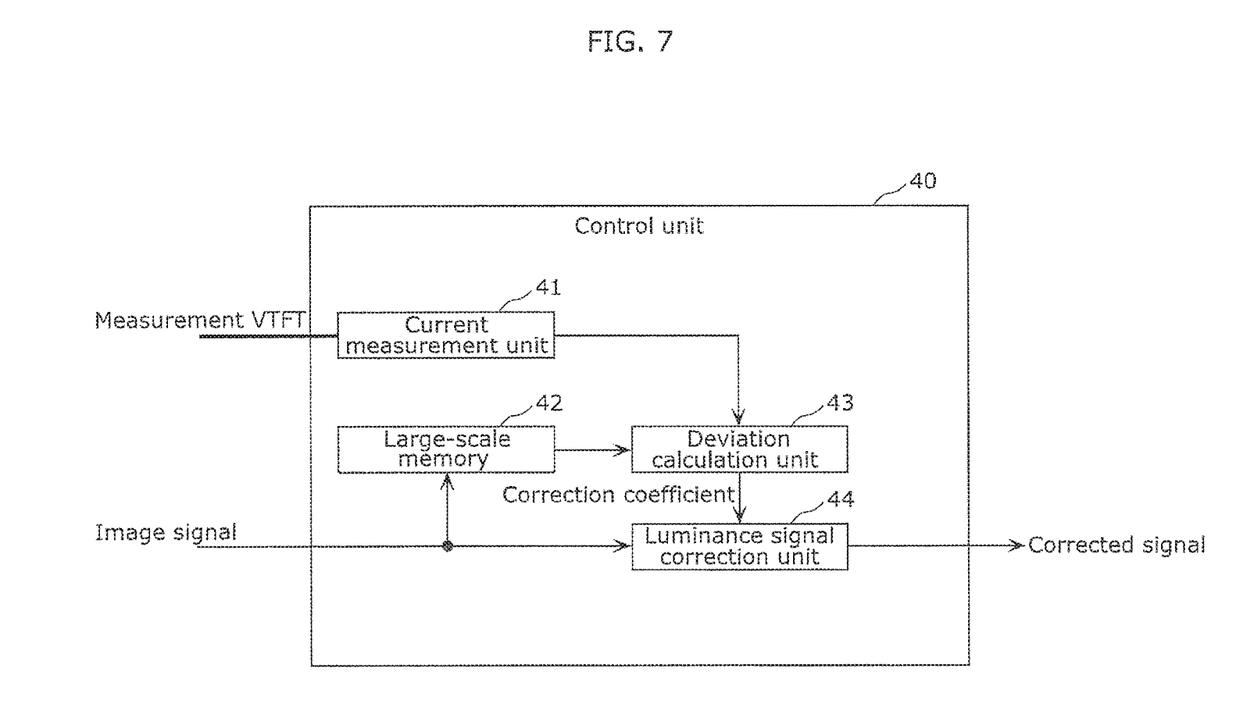
FIG. 7 is a diagram illustrating an example of the structure of a control unit (partial) in the embodiment.

The degradation addressing circuit is a circuit that corrects the luminance signal in response to the degradation of the display pixel. FIG. 7 is a diagram illustrating an example of the structure of the degradation addressing circuit. The control unit 40 includes the current measurement unit 41, large-scale memory 42, a deviation calculation unit 43, and a luminance signal correction unit 44, as a degradation addressing function.

The current measurement unit 41 measures the current flowing through the monitoring line LTFT2 for supplying the voltage VTFT to the measurement pixel.

The large-scale memory 42 is, for example, memory such as flash memory. The large-scale memory 42 need not necessarily be memory used exclusively for the degradation addressing circuit, and may be shared by the image display circuit. The large-scale memory 42 stores parameters for calculating the theoretical first correction amount of the luminance signal of the measurement pixel and the theoretical third correction amount of the luminance signal of the display pixel. The parameters for calculating the first correction amount and the third correction amount may include, for example, data indicated by the luminance signal, the temperature condition, etc. The large-scale memory 42 may store the results of calculating the first correction amount and the third correction amount instead of the parameters, or store both the parameters and the calculation results.

The deviation calculation unit 43 calculates the deviation between the theoretically calculated first correction amount of the luminance signal and the second correction amount of the luminance signal calculated from the current measured by the current measurement unit 41, for the measurement pixel in a predetermined degradation state. The deviation calculation unit 43 calculates a correction coefficient for correcting the theoretical third correction amount of the luminance signal of the display pixel, using the deviation.

The luminance signal correction unit 44 corrects the third correction amount of the luminance signal of the display pixel PIX, using the correction coefficient calculated by the deviation calculation unit 43.

The power circuit 60 is a circuit that generates various powers including the voltage VTFT, and includes a DCDC converter 61 that supplies the voltage VTFT to the pixel unit 10. The power circuit 60 also supplies predetermined powers to YIC1 for supplying the reference voltage (driver IC reference voltage) of the COF 20 to the COF 20 and YIC2 for supplying the luminance signal VData of the measurement pixel to the COF 20.

(1-2. Operation of Display Device)

Figure 8:
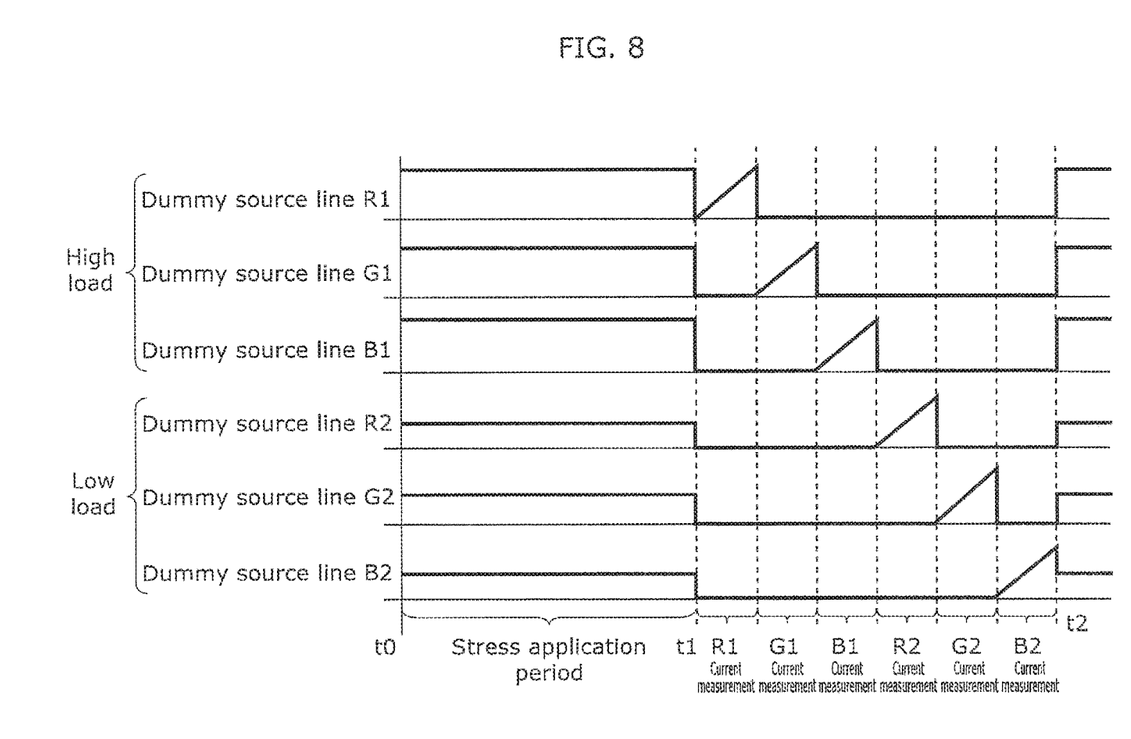
FIG. 8 is a graph illustrating an example of a stress application method for measurement pixels in the embodiment.
Figure 9:
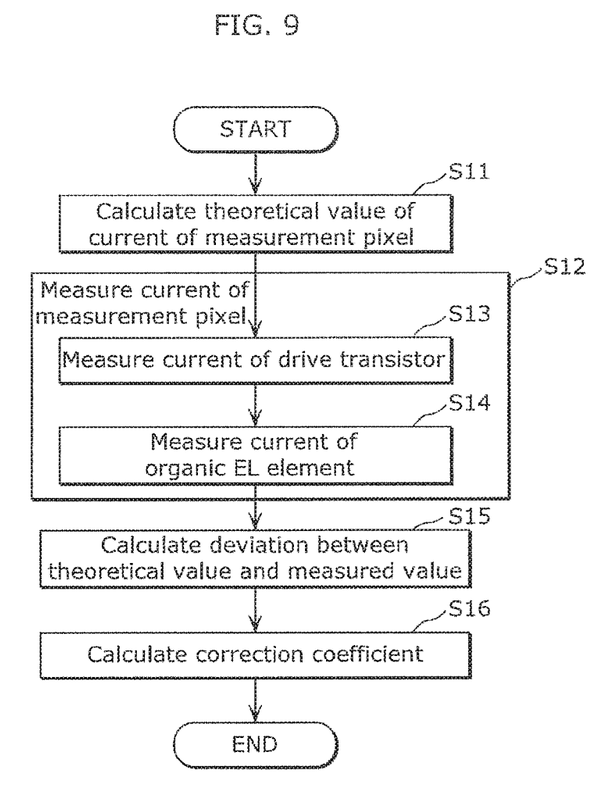
FIG. 9 is a flowchart illustrating a method of calculating a correction coefficient of a luminance signal in the embodiment.
Figure 10:
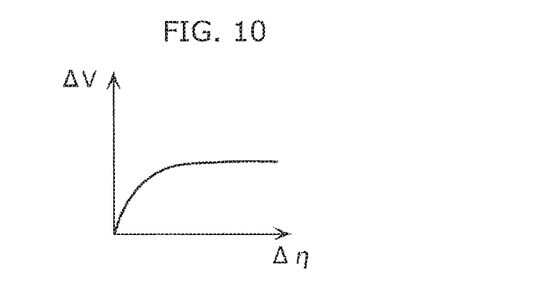
FIG. 10 is a graph illustrating the relationship between the change $\Delta\eta$ of the light emission efficiency and the change $\Delta\eta$ of the inter-terminal voltage of a measurement element in the embodiment.

The following describes the operation (luminance signal correction) of the organic EL display 100 with reference to FIGS. 8 to 10.

In this embodiment, the deviation between the theoretically calculated first correction amount of the luminance signal and the second correction amount of the luminance signal calculated from the measured current is calculated for the measurement pixel in the predetermined degradation state, and the theoretically calculated third correction amount of the luminance signal of the display pixel is corrected using the deviation, as mentioned above.

In the following description, the degradation state of the measurement pixel and the degradation state of the display pixel when calculating the correction coefficient are respectively referred to as "first degradation state" and "second degradation state".

(1-2-1. Measurement Pixel Degradation Process)

A measurement pixel degradation process is described first.

The control unit 40 performs operation for degrading the measurement pixel depending on the degradation state of the display pixel, when causing the display unit 110 to display the image corresponding to the image signal.

In more detail, when causing the display unit 110 to display the image corresponding to the image signal, the control unit 40 simultaneously supplies the measurement luminance signal corresponding to the image signal to the measurement pixel to cause the measurement pixel to actually emit light. This causes the flow of current through the measurement pixel, and the measurement pixel degrades.

FIG. 8 illustrates the signal waveform of the luminance signal applied to the data line Data ("dummy source line" in FIG. 8) connected to the measurement pixel. The stress application period of time t0 to t1 in FIG. 8 corresponds to the operation for degrading the measurement pixel. FIG. 8 illustrates the signal waveform of the luminance signal in the case of applying a high load to the measurement pixel for the measurement pixels R1, G1, and B1, and the signal waveform of the luminance signal in the case of applying a low load to the measurement pixel for the measurement pixels R2, G2, and B2. Thus, the measurement pixels are classed into two groups, and degraded by two types of degradation amount corresponding to two loads.

(1-2-2. Process of Accumulating Data for Calculating Theoretical Value)

When displaying the image on the display unit 110, the control unit 40 accumulates, for each display pixel, a parameter (hereafter referred to as "display pixel theoretical value calculation parameter") for calculating the theoretical third correction amount of the luminance signal of the display pixel in the second degradation state, in the large-scale memory 42.

The parameter includes data indicated by the luminance signal, the temperature condition, etc. The large-scale memory 42 cumulatively stores the parameter.

Likewise, the control unit 40 accumulates, for each measurement pixel, a parameter (hereafter referred to as "measurement pixel theoretical value calculation parameter") for calculating the theoretical first correction amount of the luminance signal of the measurement pixel in the first degradation state, in the large-scale memory 42.

(1-2-3. Calculation of Correction Coefficient of Luminance Signal)

A method of calculating the correction coefficient for correcting the theoretical third correction amount of the luminance signal of the display pixel PIX in this embodiment is described below, with reference to FIGS. 9 and 10. FIG. 9 is a flowchart illustrating the correction coefficient calculation method in this embodiment.

In this embodiment, the correction coefficient is calculated not on a frame basis but each time an event such as the start of the organic EL display 100 occurs and at regular time intervals such as one hour. This is because the correction coefficient is likely to change not on a frame basis but each time degradation progresses to some extent.

The deviation calculation unit 43 in the control unit 40 calculates the theoretical first correction amount of the luminance signal for the measurement pixel in the first degradation state, using the measurement pixel theoretical value calculation parameter stored in the large-scale memory 42 (Step S11).

In more detail, the deviation calculation unit 43 calculates a theoretical first gate voltage as a gate voltage necessary for obtaining a desired current, for the measurement transistor in the first degradation state (part of a first deviation calculation process). The large-scale memory 42 stores a relational expression or table indicating the relationship between the measurement pixel theoretical value calculation parameter and the first gate voltage. The deviation calculation unit 43 applies the measurement pixel theoretical value calculation parameter stored in the large-scale memory 42 to the relational expression or table, to calculate the first gate voltage.

The deviation calculation unit 43 further calculates a theoretical first current as a current necessary for obtaining a desired light emission amount (part of a second deviation calculation process). The large-scale memory 42 stores a relational expression or table indicating the relationship between the measurement pixel theoretical value calculation parameter and the first current. The deviation calculation unit 43 applies the measurement pixel theoretical value calculation parameter stored in the large-scale memory 42 to the relational expression or table, to calculate the first current.

Following this, the current measurement unit 41 measures the current flowing through the measurement pixel in the first degradation state (Step S12). In this embodiment, two types of measurement pixel degradation are set as illustrated in FIG. 8, so that the measured current is likely to differ depending on the degradation amount. Since one correction coefficient is calculated for the whole display pixel, however, the current corresponding to the average degradation amount is determined using the measurement result.

The measurement transistor and the measurement element differ in characteristics, and accordingly different current measurement methods are used in this embodiment. The measurement of the current for calculating the deviation of the correction amount of the luminance signal associated with the measurement transistor and the measurement of the current for calculating the deviation of the correction amount of the luminance signal associated with the measurement element need to be performed separately. This is described in detail below.

To calculate the deviation of the correction amount of the luminance signal associated with the measurement transistor, the current measurement unit 41 adjusts the source-drain voltage of the measurement transistor to cause the measurement transistor to operate in a saturated region, and measures the current flowing through the monitoring line LTFT2 (Step S13).

Regarding the measurement transistor, the deviation of the correction amount (first deviation) is represented by the ratio between the aforementioned theoretical first gate voltage and a second gate voltage necessary for causing the flow of the desired current as calculated from the measured current in the measurement transistor in the first degradation state. The measurement transistor is therefore caused to operate in the saturated region where the current is constant regardless of the variation of the gate voltage.

To calculate the deviation of the correction amount of the luminance signal associated with the measurement element, the current measurement unit 41 adjusts the source-drain voltage of the measurement transistor to cause the measurement transistor to operate in a linear region, and measures the current flowing through the monitoring line LTFT2 (Step S14). Here, the drive transistor T5 which is the measurement transistor is caused to operate in the linear region. In this case, the source-drain voltage Vds of the drive transistor T5 changes with the voltage of the OEL element OEL1. If the drive transistor T5 is used in the saturated region, the current flowing between the source and drain of the drive transistor T5 hardly changes even when the source-drain voltage Vds of the drive transistor T5 changes. In other words, if the drive transistor T5 is used in the saturated region, the voltage difference of the OEL element OEL1 hardly influences the current. If the drive transistor T5 is used in the linear region, on the other hand, the change ΔV of the inter-terminal voltage of the OEL element OEL1 appears in the change ΔI of the current, so that ΔV can be measured by measuring the current.

Regarding the measurement element, the deviation of the correction amount (second deviation) is represented by the ratio between the aforementioned theoretical first current and a second current necessary for obtaining the desired light emission amount as calculated from the measured current in the measurement element in the first degradation state. In this embodiment, the light emission amount cannot be directly measured, but it is known that the change Δη of the light emission efficiency and the change ΔV of the inter-terminal voltage of the measurement element correlate with each other.

FIG. 10 is a graph illustrating the relationship between the change Δη of the light emission efficiency and the change ΔV of the inter-terminal voltage of the measurement element. In this embodiment, the deviation of the correction amount is calculated using this correlation. The deviation of the correction amount is thus calculated from the correlation between the change ΔV of the inter-terminal voltage and the change ΔI of the current of the measurement element.

Here, given that it is difficult to directly measure the inter-terminal voltage of the measurement element, the correlation (IV characteristics) between the change ΔIds (=ΔI) of the source-drain current Ids and the change ΔVds (VTFT−ΔV) of the source-drain voltage Vds when causing the measurement transistor to operate in the linear region is used in this embodiment. For example, by measuring the current for each of two or more levels of the voltage VTFT, the relationship between the change ΔI of the current and the change ΔV of the inter-terminal voltage of the measurement element can be determined from the IV characteristics of the measurement transistor.

The deviation calculation unit 43 calculates the aforementioned deviation (Step S15). In detail, the deviation calculation unit 43 calculates the deviation of the correction amount of the gate voltage of the measurement transistor (part of the first deviation calculation process) and the deviation of the correction amount of the current of the measurement element (part of the second deviation calculation process).

First, the deviation calculation unit 43 calculates the second gate voltage necessary for obtaining the desired current, from the current of the measurement transistor measured in Step S13 (measured gate voltage).

The deviation calculation unit 43 calculates the first deviation between the theoretical first gate voltage of the measurement transistor calculated in Step S11 and the second gate voltage calculated using the measured current. In more detail, the first deviation is calculated as "(second gate voltage)/(first gate voltage)" in the measurement transistor.

The deviation calculation unit 43 then calculates the change $\Delta\eta$ of the light emission efficiency, using the result of measuring the current of the measurement element in Step S14. The change $\Delta\eta$ of the light emission efficiency is determined from the IV characteristics in the case of causing the measurement transistor to operate in the linear region, as mentioned above. The large-scale memory 42 stores the relational expression or table indicating the relationship between $\Delta\eta$ and $\Delta V$. The deviation calculation unit 43 calculates $\Delta V$ from the current of the measurement element measured in Step S14, and calculates $\Delta\eta$ from the relationship between $\Delta\eta$ and $\Delta V$ stored in the large-scale memory 42. The deviation calculation unit 43 further calculates the second current (the second current calculated from the measured value) necessary for obtaining the desired light emission amount, using the change $\Delta\eta$ of the light emission efficiency. The deviation calculation unit 43 calculates the second deviation between the theoretical first current of the measurement pixel calculated in Step S11 and the second current calculated from the measured value. In more detail, the second deviation is calculated as "(second current)/(first current)".

The luminance signal correction unit 44 calculates the correction coefficient for correcting the corrected signal of the luminance signal of the display pixel PIX, using the first deviation and the second deviation (Step S16). Here, the correction coefficient is calculated as "(first deviation)× (second deviation)".

In this embodiment, the correction coefficient is calculated for each color. In the case where there are a plurality of measurement pixels of each color, the average correction coefficient in the plurality of measurement pixels may be used as the correction coefficient of the display pixel PIX.

(1-2-4. Luminance Signal Correction)

A method of correcting the luminance signal in this embodiment is described below.

The luminance signal correction unit 44 in the control unit 40 multiplies the theoretically calculated third correction amount (=corrected luminance signal or corrected signal) of the luminance signal of the display pixel PIX by the correction coefficient, to calculate a fourth correction amount of the luminance signal of the display pixel PIX.

The luminance signal is corrected for each frame of the image signal and for each display pixel PIX. The correction coefficient is, however, common to all frames and all display pixels PIX. This is because the cause of the deviation between the theoretical value and measured value of degradation, such as the recovery from the degradation at power off or the surrounding environment such as temperature or humidity, is substantially the same for the whole organic EL display 100, and so the deviation of the correction amount is likely to be substantially the same for the whole organic EL display 100.

When displaying the image on the display pixel PIX, the control unit 40 multiplies, by the aforementioned correction coefficient, the luminance signal (third correction amount) obtained by theoretically correcting the luminance of the image signal depending on the second degradation state, to calculate the fourth correction amount. The control unit 40 displays the image using the fourth correction amount. The correction coefficient is common to the plurality of display pixels PIX, as mentioned above.

(1-3. Effects, etc.)

The organic EL display 100 in this embodiment calculates the deviation between the theoretical first correction amount and the second correction amount calculated from the measured current in the measurement pixel, and corrects the theoretical third correction amount in the display pixel PIX. This enables image display responsive to the actual degradation state of the organic EL display 100.

The display device described in PTL 1 directly measures the current and light emission amount of the organic EL element OEL1 and calculates the luminance signal actually used for the display pixel. In this embodiment, on the other hand, the deviation of the correction amount is calculated, and so there is no need to measure the light emission amount.

The measurement unit 120 in this embodiment is located between the COFs 22 each including the scan line drive circuit and the display unit 110. This allows the measurement unit 120 to share the scan lines SCN with the display unit 110, and therefore no dedicated scan lines SCN for the measurement unit 120 are necessary.

(1-4. Variations)

(1) Although the foregoing embodiment describes the case where the common correction coefficient is calculated for the whole organic EL display 100, for example the display unit 110 in the organic EL display 100 may be divided into a plurality of blocks such as four (2×2) blocks so that the correction coefficient is calculated on a block basis. The number of blocks may be any number. The correction coefficient of each block may be calculated using the deviation of a measurement pixel in proximity to the block. A nearer measurement pixel is likely to have characteristics more similar to the characteristics of a display pixel in the block. Accordingly, the use of a nearer measurement element is likely to contribute to higher correction accuracy. In the case of calculating the correction coefficient for each block obtained by dividing the display unit 110, the measurement result of one measurement pixel may be used for a plurality of blocks.

(2) Although the foregoing embodiment describes the case where a plurality of measurement pixels are degraded by a plurality of degradation amounts corresponding to, for example, a display pixel with the largest degradation amount and a display pixel with the smallest degradation amount, this is not a limitation. In the case where there is one set of measurement pixels of RGB, the measurement pixels may be uniformly degraded by the average degradation amount of the display pixels.

In the case of degrading a plurality of measurement pixels by a plurality of degradation amounts, a plurality of correction coefficients may be calculated depending on the range of degradation amount. In this case, the correction coefficient of the display pixel can be selected according to which degradation amount range the degradation amount of the display pixel belongs.

Although the foregoing embodiment describes the case where the measurement pixels are separated as pixels with a large degradation amount to which a high load is applied and pixels with a small degradation amount to which a low load is applied, this is not a limitation.

There may be one or three or more types of degradation amount. In the case where there is one type of degradation amount, for example, the luminance signal indicating the average luminance of the display pixel PIX is generated for each color of RGB and used as the luminance signal of the measurement pixel in the measurement pixel degradation process. In this way, the degree of degradation of the measurement element and measurement transistor in the case where there is one type of degradation amount is likely to be substantially the same as the average degradation of the organic EL element and drive transistor T5 of the plurality of display pixels PIX.

(3) Each of the structural elements in the foregoing embodiment may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or semiconductor memory. For example, software for realizing the display device according to the foregoing embodiment or the like is the following program.

The program causes a computer to execute: a step (S13, S14) of measuring a current flowing through a measurement pixel in a first degradation state; a step (S15, S16) of calculating a deviation between a correction amount of a luminance signal calculated from the current measured in the step of measuring and a theoretical correction amount of the luminance signal, for the measurement pixel in the first degradation state; and a step of correcting a correction amount of a luminance signal of a display pixel PIX in a second degradation state, using a result of calculating the deviation in the step of calculating.

While the organic EL display (display device) has been described above by way of embodiments, the present disclosure is not limited to such embodiments. Other modifications obtained by applying various changes conceivable by a person skilled in the art to the embodiments and any combinations of the structural elements in different embodiments without departing from the scope of the present disclosure are also included in the scope of one or more aspects.

INDUSTRIAL APPLICABILITY

The present disclosure is applicable to an organic EL display using organic electroluminescent (EL) elements.

The invention claimed is:

1. A display device comprising:
a display including a plurality of display pixels each of which includes: an organic EL element that emits light in response to a supplied current; and a drive transistor that supplies a drive current corresponding to a magnitude of a luminance signal to the organic EL element;
a measurement pixel located outside the display and including: a measurement element composed of an organic EL element; and a measurement transistor that supplies a current corresponding to a magnitude of a measurement signal to the measurement element;
a current measurement unit configured to measure a current flowing through the measurement pixel in a predetermined degradation state;
a deviation calculation unit configured to calculate, for the measurement pixel in the predetermined degradation state, a deviation between a theoretically calculated first correction amount of the luminance signal and a second correction amount of the luminance signal calculated from the current measured by the current measurement unit; and
a luminance signal correction unit configured to correct a theoretically calculated third correction amount of the luminance signal, using a result of calculating the deviation by the deviation calculation unit,
wherein the deviation calculation unit is configured to:
perform a first deviation calculation process of calculating, for the measurement transistor in the degradation state, a first deviation between a first gate voltage calculated theoretically as a gate voltage necessary for obtaining a desired current and a second gate voltage calculated from the current measured by the current measurement unit as a gate voltage necessary for obtaining the desired current;
perform a second deviation calculation process of calculating, for the measurement element in the degradation state, a second deviation between a first current calculated theoretically as a current necessary for obtaining a desired light emission amount and a second current calculated from the current measured by the current measurement unit as a current necessary for obtaining the desired light emission amount and
calculate the deviation by combining the first deviation and the second deviation.

2. The display device according to claim 1,
wherein the current measurement unit is configured to adjust a source-drain voltage of the measurement transistor in the measurement pixel to cause the measurement transistor to operate in a saturated region, and measure the current flowing through the measurement pixel.

3. The display device according to claim 1,
wherein the current measurement unit is configured to adjust a source-drain voltage of the measurement transistor in the measurement pixel to cause the measurement transistor to operate in a linear region, and measure the current flowing through the measurement pixel.

4. The display device according to claim 1,
wherein the measurement pixel is located between a scan line drive circuit that drives a scan line for supplying a drive signal to a gate terminal of the drive transistor in each of the display pixels and the display pixels.

5. The display device according to claim 1,
wherein the display includes a plurality of blocks each of which includes a plurality of display pixels,
the measurement pixel is provided for each of the plurality of blocks, in proximity to a corresponding block, and
the deviation calculation unit is configured to calculate, for each of the plurality of blocks, the deviation using the current of the measurement pixel provided for the corresponding block.

6. A method of driving a display device, the display device including: a display including a plurality of display pixels each of which includes: an organic EL element that emits light in response to a supplied current; and a drive transistor that supplies a drive current corresponding to a magnitude of a luminance signal to the organic EL element; and a measurement pixel located outside the display and including: a measurement element composed of an organic EL element; and a measurement transistor that supplies a current corresponding to a magnitude of a measurement signal to the measurement element, the method comprising:

measuring a current flowing through the measurement pixel in a predetermined degradation state;

calculating, for the measurement pixel in the degradation state, a deviation between a theoretically calculated first correction amount of the luminance signal and a second correction amount of the luminance signal calculated from the current measured in the measuring; and correcting a theoretically calculated third correction amount of the luminance signal, using a result of the deviation calculated in the calculating, wherein the calculating the deviation includes:

performing a first deviation calculation process of calculating, for the measurement transistor in the degradation state, a first deviation between a first gate voltage calculated theoretically as a gate voltage necessary for obtaining a desired current and a second gate voltage calculated from the current measured in the measuring as a gate voltage necessary for obtaining the desired current;

performing a second deviation calculation process of calculating, for the measurement element in the degradation state, a second deviation between a first current calculated theoretically as a current necessary for obtaining a desired light emission amount and a second current calculated from the current measured in the measuring as a current necessary for obtaining the desired light emission amount; and calculating the deviation by combining the first deviation and the second deviation.

7. A display device comprising:

a display including a plurality of display pixels each of which includes: an organic EL element that emits light in response to a supplied current; and a drive transistor that supplies a drive current corresponding to a magnitude of a luminance signal to the organic EL element;

a measurement pixel located outside the display and including: a measurement element composed of an organic EL element; and a measurement transistor that supplies a current corresponding to a magnitude of a measurement signal to the measurement element;

a processor; and a memory including a program that, when executed by the processor, causes the processor to perform operations including:

measuring a current flowing through the measurement pixel in a predetermined degradation state;

calculating, for the measurement pixel in the degradation state, a deviation between a theoretically calculated first correction amount of the luminance signal and a second correction amount of the luminance signal calculated from the current measured in the measuring; and correcting a theoretically calculated third correction amount of the luminance signal, using a result of the deviation calculated in the calculating, wherein the calculating the deviation includes:

performing a first deviation calculation process of calculating, for the measurement transistor in the degradation state, a first deviation between a first gate voltage calculated theoretically as a gate voltage necessary for obtaining a desired current and a second gate voltage calculated from the current measured in the measuring as a gate voltage necessary for obtaining the desired current;

performing a second deviation calculation process of calculating, for the measurement element in the degradation state, a second deviation between a first current calculated theoretically as a current necessary for obtaining a desired light emission amount and a second current calculated from the current measured in the measuring as a current necessary for obtaining the desired light emission amount; and calculating the deviation by combining the first deviation and the second deviation.

* * * * *